(12) United States Patent
De Ceuster

(10) Patent No.: US 7,804,022 B2
(45) Date of Patent: Sep. 28, 2010

(54) SOLAR CELL CONTACT FINGERS AND SOLDER PAD ARRANGEMENT FOR ENHANCED EFFICIENCY

(75) Inventor: Denis De Ceuster, Woodside, CA (US)

(73) Assignee: Sunpower Corporation, San Jose, CA (US)

( * ) Notice: Subject to any disclaimer, the term of this patent is extended or adjusted under 35 U.S.C. 154(b) by 714 days.

(21) Appl. No.: 11/725,023

(22) Filed: Mar. 16, 2007

(65) Prior Publication Data

US 2008/0223437 A1    Sep. 18, 2008

(51) Int. Cl.
*H01L 51/00* (2006.01)

(52) U.S. Cl. ............... 136/256; 136/243; 136/252; 438/57; 438/98

(58) Field of Classification Search ............ 136/244, 136/256; 438/98; 29/855
See application file for complete search history.

(56) References Cited

U.S. PATENT DOCUMENTS

| | | | |
|---|---|---|---|
| 4,478,879 A | 10/1984 | Baraona et al. | |
| 4,927,770 A | 5/1990 | Swanson | |
| 4,933,022 A | 6/1990 | Swanson | |
| 5,053,083 A | 10/1991 | Sinton | |
| 2005/0172996 A1 | 8/2005 | Hacke et al. | |
| 2005/0268959 A1* | 12/2005 | Aschenbrenner et al. | 136/244 |
| 2006/0060238 A1* | 3/2006 | Hacke et al. | 136/256 |
| 2008/0096297 A1* | 4/2008 | Schiaffino et al. | 438/22 |
| 2008/0128268 A1* | 6/2008 | Lopatin et al. | 204/192.1 |
| 2008/0216887 A1* | 9/2008 | Hacke et al. | 136/244 |

OTHER PUBLICATIONS

Eikelboom et al., Conductive Adhesives for Interconnection of Busbarless Emitter Wrap-Through Solar Cells on a Structured Metal Foil, presented at the 17th European Photovoltaic Soalr Energy Conference, Minich, Germany, Oct. 22-26, 2001.*
Wolfgang Joob, "Multicrystalline and Back Contact Buried Contact Silicon Solar Cells", Jul. 17, 2002, pp. 1-140, Physics Dept., Konstanz University, Germany.
International Search Report for PCT application No. PCT/US08/00335, Jul. 20, 2009, 2 sheets.

* cited by examiner

*Primary Examiner*—Jennifer K Michener
*Assistant Examiner*—Jayne Mershon
(74) *Attorney, Agent, or Firm*—Okamoto & Benedicto LLP

(57) ABSTRACT

A solar cell includes negative metal contact fingers electrically connected to N-type diffusion regions of the solar cell and positive metal contact fingers electrically connected to P-type diffusion regions of the solar cell. Both the N-type and P-type diffusion regions are on the backside of the solar cell. The solar cell includes a front side that faces the sun during normal operation. The negative and positive metal contact fingers may be interdigitated. For increased solar radiation collection, the metal contact fingers may be arranged to point to and collectively cover portions of a perimeter of a solder pad. For example, the negative metal contact fingers may be arranged to point to and collectively cover two or three sides of a solder pad.

14 Claims, 7 Drawing Sheets

US 7,804,022 B2

SOLAR CELL CONTACT FINGERS AND SOLDER PAD ARRANGEMENT FOR ENHANCED EFFICIENCY

BACKGROUND OF THE INVENTION

1. Field of the Invention

The present invention relates generally to solar cells and more particularly but not exclusively to solar cell interconnect structures.

2. Description of the Background Art

Solar cells are well known devices for converting solar radiation to electrical energy. They may be fabricated on a semiconductor wafer using semiconductor processing technology. Generally speaking, a solar cell may be fabricated by forming P-type and N-type diffusion regions in a silicon substrate. Solar radiation impinging on the solar cell creates electrons and holes that migrate to the diffusion regions, thereby creating voltage differentials between the diffusion regions. In a backside junction solar cell, both the diffusion regions and the metal contact fingers coupled to them are on the backside of the solar cell. The contact fingers allow an external electrical circuit to be coupled to and be powered by the solar cell.

Efficiency is an important characteristic of a solar cell as it is directly related to the solar cell's capability to generate power. Accordingly, techniques for increasing the efficiency of solar cells are generally desirable. The present invention provides improved solar cell contact fingers and solder pad arrangements that allow for higher efficiency compared to conventional solar cells.

SUMMARY

In one embodiment, a solar cell includes negative metal contact fingers electrically connected to N-type diffusion regions of the solar cell and positive metal contact fingers electrically connected to P-type diffusion regions of the solar cell. Both the N-type and P-type diffusion regions are on the backside of the solar cell. The solar cell includes a front side that faces the sun during normal operation. The negative and positive metal contact fingers may be interdigitated. For increased solar radiation collection, the metal contact fingers may be arranged to point to and collectively cover portions of a perimeter of a solder pad. For example, the negative metal contact fingers may be arranged to point to and collectively cover two or three sides of a solder pad.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of structures and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
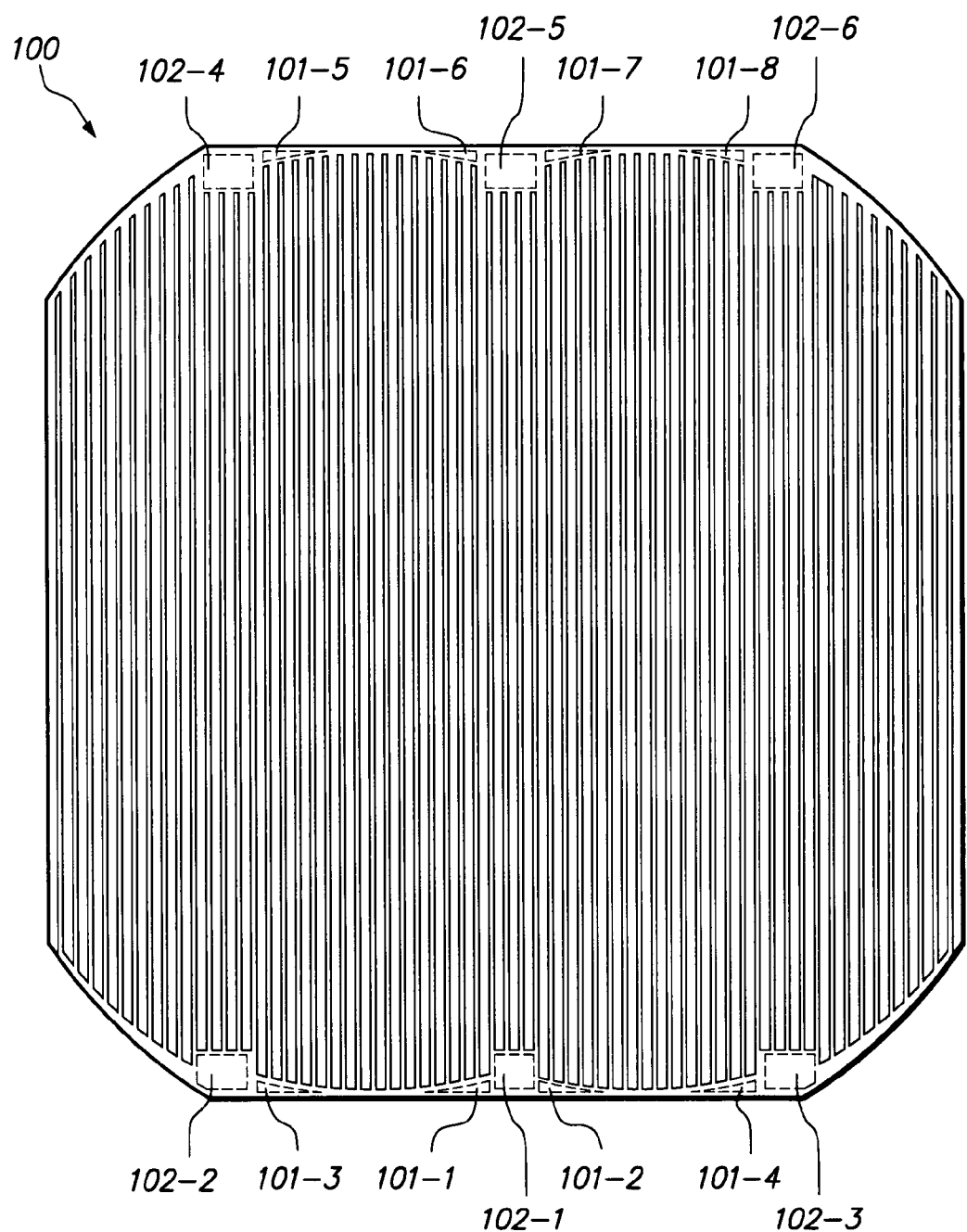
FIG. 1 shows a backside of an example conventional solar cell.

FIG. 1 shows a backside of an example conventional solar cell 100. The solar cell 100 includes a plurality of solder pads 102 (i.e., 102-1, 102-2, . . . ) and bus bars 101 (i.e., 101-1, 101-2, . . . ) on each edge portion. The solder pads 102 and bus bars 101 have been generally marked with dashed lines. In FIG. 1, the solder pads 102-1, 102-2, and 102-3 are on the negative polarity edge portion of the solar cell 100, while the solder pads 1024, 102-5, and 102-6 are on the positive polarity edge portion. The solder pads 102 provide a surface on which an interconnect lead electrically connecting the solar cell 102 to another solar cell may be attached. The bus bars 101 electrically connect metal contact fingers of a particular polarity to their closest corresponding solder pad 102 on a particular edge portion.

Figure 2:
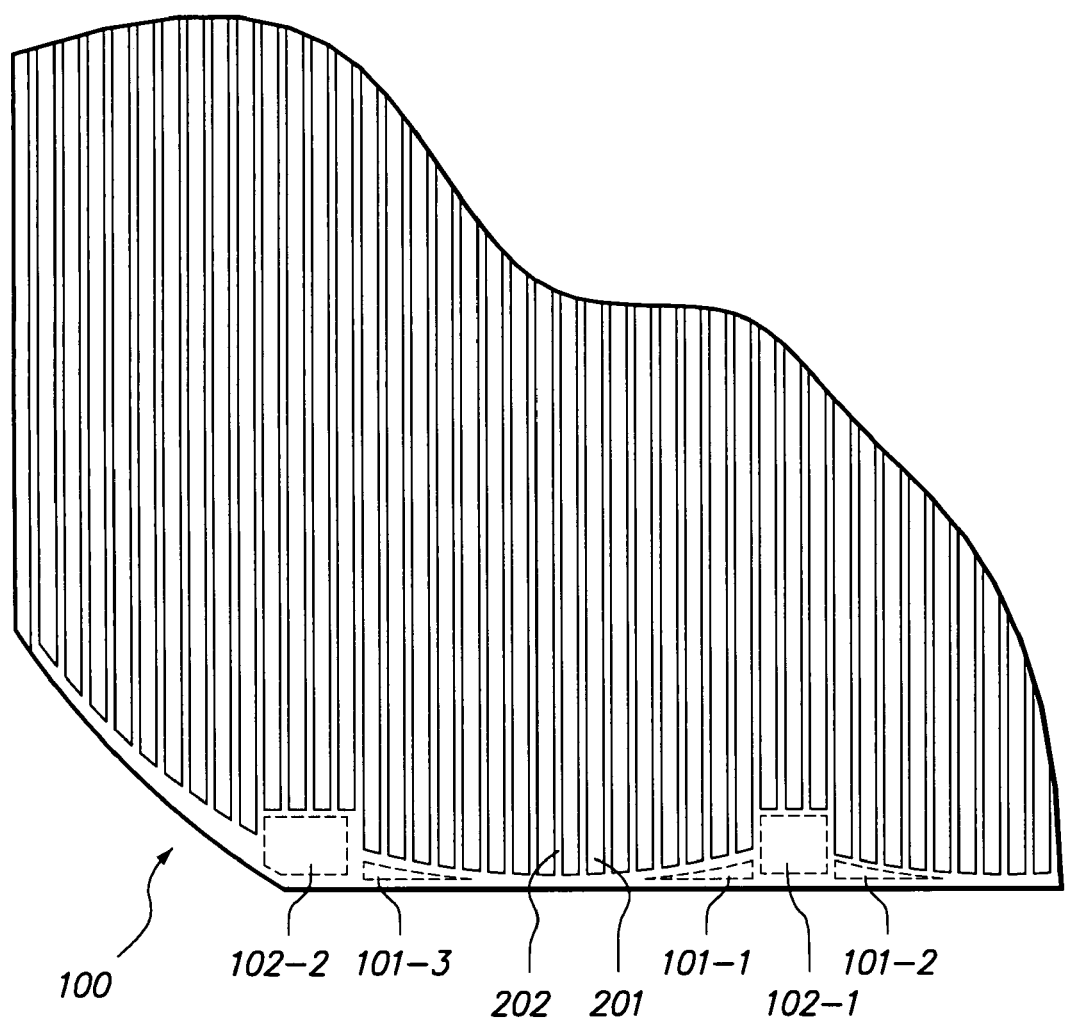
FIG. 2 shows a magnified view of the lower left side of the solar cell of FIG. 1.

FIG. 2 shows a magnified view of the lower left side of the solar cell 100 of FIG. 1. FIG. 2 also labels the metal contact fingers 201 and 202. Metal contact fingers 201 electrically connect the P-type diffusion regions of the solar cell 100 to the solder pads 102 and bus bars 101 on the positive edge portion. Metal contact fingers 202 electrically connect the N-type diffusion regions of the solar cell 100 to the solder pads 102 and bus bars 101 on the negative edge portion. Only one metal contact finger 201 and metal contact finger 202 has been labeled to avoid cluttering the figure.

As is evident in FIGS. 1 and 2, the metal contact fingers 201 and 202 are arranged such that they point towards the edge portion of the solar cell 100. To maintain uniform current density between the current carried by the metal contact fingers and a bus bar 101, the bus bar 101 is arranged to occupy an increasingly larger area, hence the tapered bus bars 101 of the solar cell 100. This design feature is further explained with reference to FIG. 3.

Figure 3:
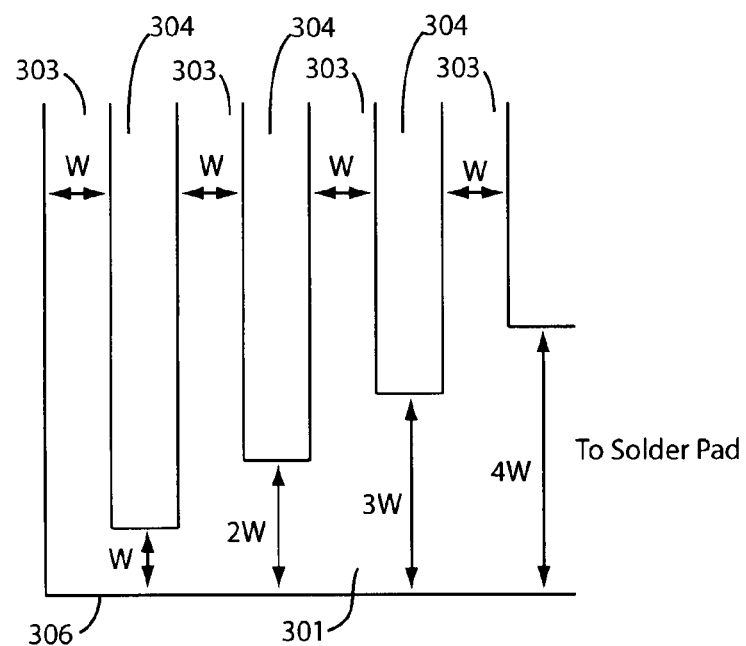
FIG. 3 schematically shows metal contact fingers having ends that are oriented to point towards an edge portion of an example solar cell.

FIG. 3 schematically shows metal contact fingers 303 and 304 having ends that are oriented toward an edge portion 306. In the example of FIG. 3, the metal contact fingers 303 electrically connect to a bus bar 301, which in turn terminates to a solder pad (not shown). The metal contact fingers 304 electrically connect to a solder pad on the other edge portion (not shown) of the solar cell. Each metal contact finger 303 has a width "W". To maintain uniform current density, the bus bar 301 is tapered to have an increasing width as measured from the edge portion 306. In FIG. 3, the bus bar 301 widens left to right from a width of W to 4 W (i.e., four times the width W).

While the solar cell 100 is very efficient, the inventor discovered that there is very little solar radiation collection on regions of the solar cell 100 occupied by the bus bars 101. The inventor also discovered that efficiency of a solar cell can be enhanced by interdigitating metal contact fingers on areas previously occupied by bus bars. One way of doing so is to orient the metal contact fingers such that their ends point to and collectively cover substantial portions of a perimeter of a solder pad. Embodiments of the present invention are now described beginning with FIG. 4.

Figure 4:
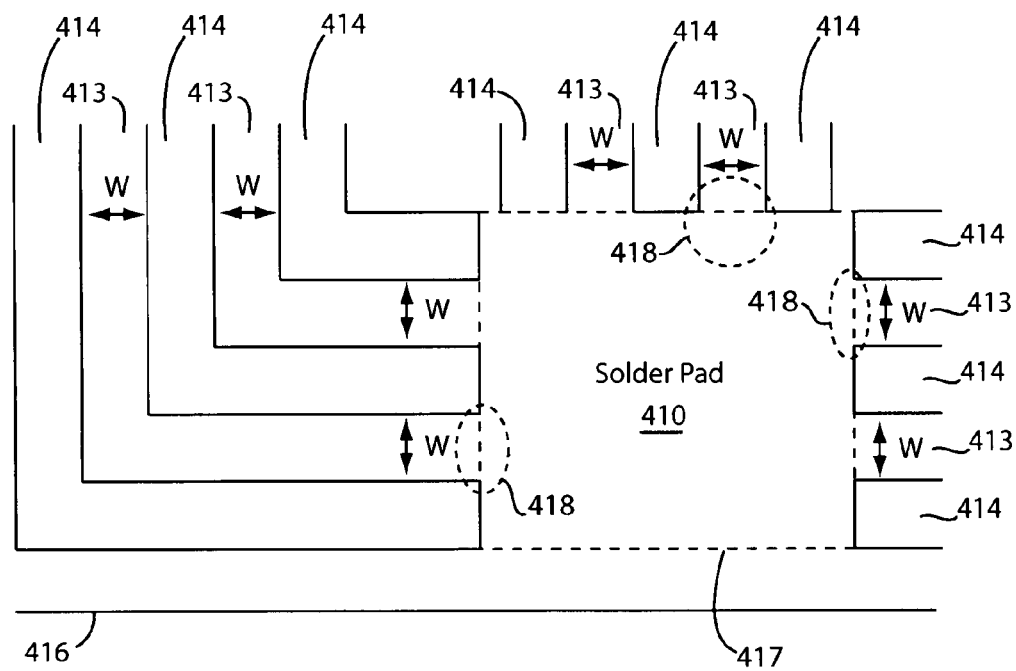
FIG. 4 schematically shows a solar cell contact arrangement in accordance with an embodiment of the present invention.

FIG. 4 schematically shows a solar cell contact arrangement in accordance with an embodiment of the present invention. In the example of FIG. 4, metal contact fingers 413 and 414 are interdigitated, with the metal contact fingers 413 being electrically connected to N-type diffusion regions on the backside of the solar cell and the metal contact fingers 414 being electrically connected to P-type diffusion regions also on the backside of the solar cell. The metal contact fingers 414 electrically connect to solder pads (not shown) on the other side of the solar cell opposite to an edge 416. Each metal contact finger 413 has a width "W" in the example of FIG. 4. Ends of some of the metal contact fingers 413 have been generally bounded by dashed lines 418 for ease of illustration.

The metal contact fingers 413 may be arranged to have their ends point towards the solder pad 410. More particularly, in the example of FIG. 4, the metal contact fingers 413 end on a perimeter 417 of the solder pad 410. This removes the bus bar that predominantly has a single polarity contact, with one that is interdigitated with positive and negative contacts. Put another way, the conventional bus bar has been eliminated to reclaim more of the solar cell surface for solar radiation collection.

In the example of FIG. 4, the metal contact fingers 413 are arranged to have their ends surround three sides of a rectangular solder pad 410, which is equivalent to surrounding about 75% of the perimeter 417 in FIG. 4. Preferably, the ends of the metal contact fingers 413 are arranged such that they point towards and surround as much of the perimeter of 417 as possible or at least 50% of the solder pad 410. As can be appreciated, the solder pad 410 does not necessarily have to be rectangular. For example, with a circular solder pad, the ends of the metal contact fingers 413 may be configured to point to and surround the perimeter of the solder pad within a 180° radius, 90° radius, etc. Each metal contact finger 413 preferably terminates on the perimeter of the solder pad 410. However, for optimization purposes, two metal contact fingers may end on the same contact finger, which in turn ends directly on the solder pad 410.

Figure 5:
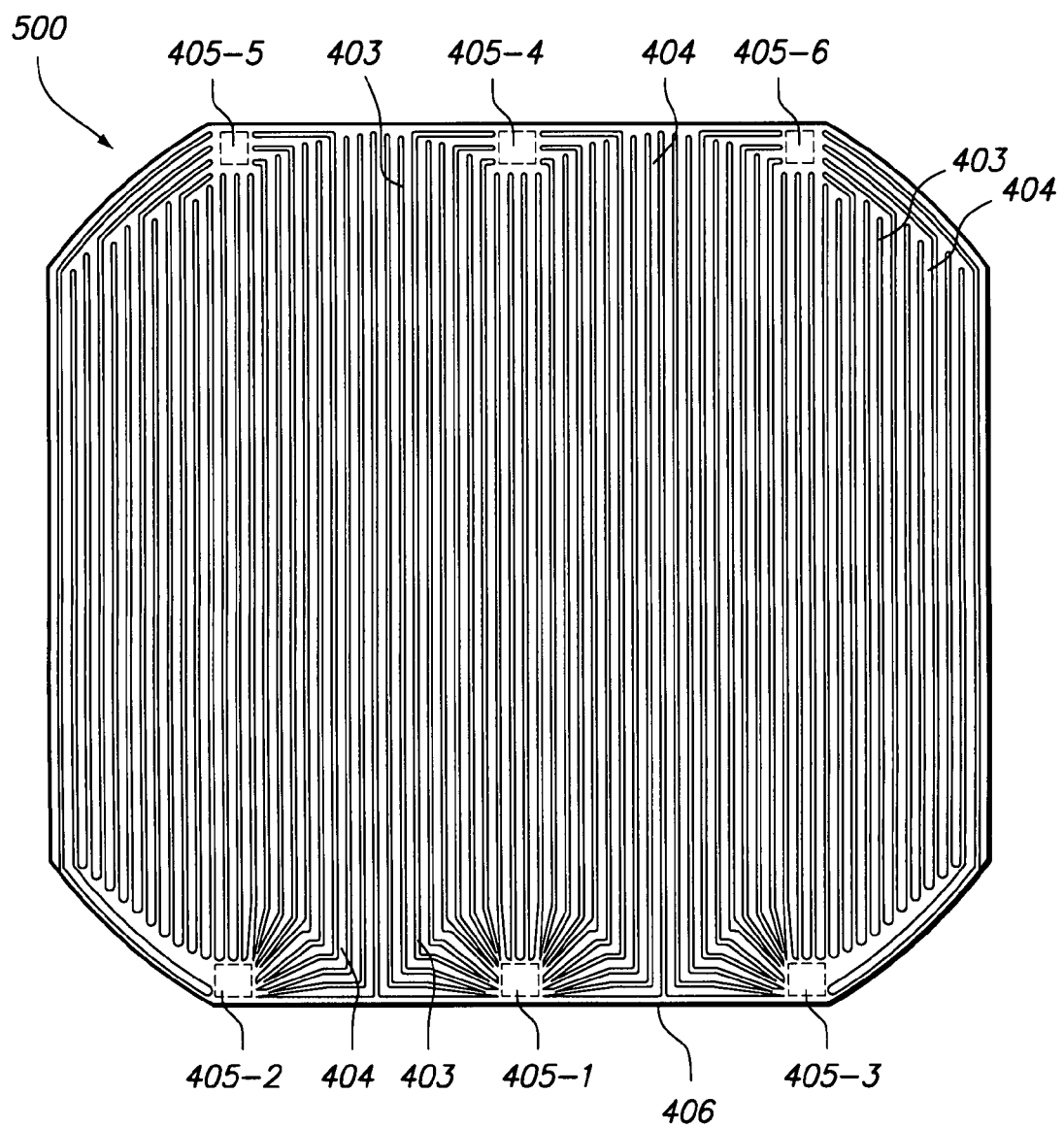
FIG. 5 shows a backside view of a solar cell in accordance with an embodiment of the present invention.

FIG. 5 shows a backside view of a solar cell 500 in accordance with an embodiment of the present invention. The solar cell 500 includes a plurality of solder pads 405 (i.e., 405-1, 405-2, . . . ) on opposing edges of the solar cell. The solder pads 405 have been generally marked with dashed lines. In FIG. 5, the solder pads 405-1, 405-2, and 405-3 are on the negative edge portion of the solar cell 500, while the solder pads 405-4, 405-5, and 405-6 are on the positive edge portion. The solder pads 405 provide a surface on which an interconnect lead electrically connecting the solar cell 500 to another solar cell may be attached. Metal contact fingers 404 electrically connect the P-type diffusion regions of the solar cell 500 to the solder pads 405 on the positive edge portion. Metal contact fingers 403 electrically connect the N-type diffusion regions of the solar cell 500 to the solder pads 405 on the negative edge portion. A solder pad 405 may only connect to a metal contact finger for the same polarity. Only a few of the metal contact fingers 403 and 404 have been labeled in the interest of clarity.

Figure 6:
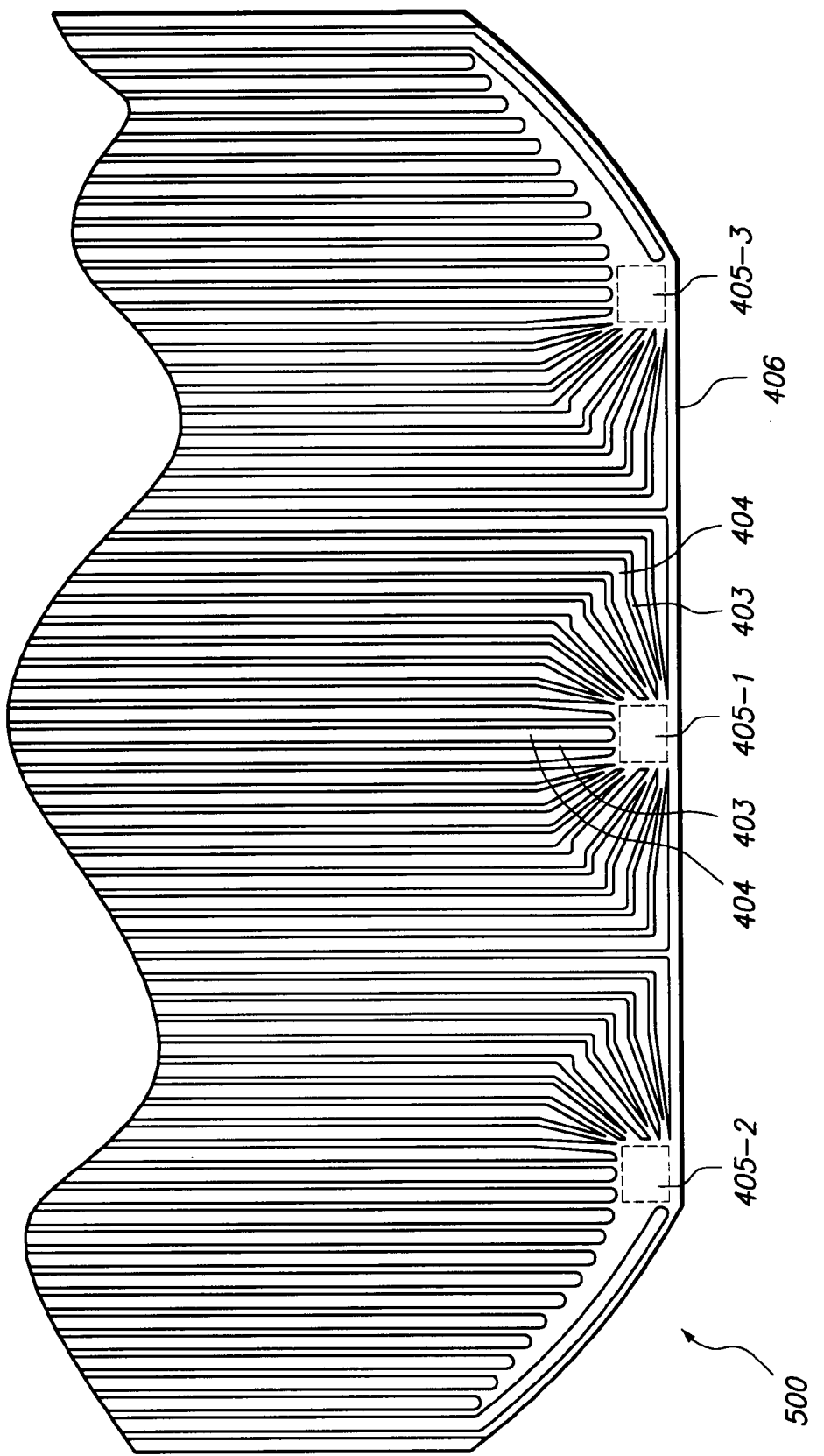
FIG. 6 shows a magnified view of the negative edge portion of the solar cell of FIG. 5.

FIG. 6 shows a magnified view of the negative edge portion of the solar cell 500, which is at the bottom of FIG. 5. As is evident from FIGS. 5 and 6, the metal contact fingers 403 and 404 and solder pads 405 are laid out using the principles previously described with reference to FIG. 4. For example, the metal contact fingers 403 are arranged such that their ends are oriented to point towards and surround the perimeter of the solder pad 405, covering 75% (three sides) for the solder pad 405-1 and 50% (two sides) for the solder pads 405-2 and 405-3. Note that what was previously occupied by bus bars 101-1 and 101-2 in the solar cell 100 of FIG. 1 has now been occupied by interdigitated metal contact fingers 403 and 404, with the metal contact fingers leading to the solder pad 405-1.

In the example of FIG. 6, some pairs of metal contact fingers 403 join or branch in together to share a contact finger that electrically connects to and terminates on a solder pad 405. Preferably three or less metal contact fingers may join together to a single metal contact finger that leads towards and terminates on a solder pad 405. Joining more than three metal contact fingers would result in the shared metal contact finger having a width greater than three times the width of a single metal contact finger. This may result in unacceptable efficiency penalty, depending on the width of each metal contact finger.

As is further evident in FIG. 6, there is no bus bar or metal finger having a width greater than that of two metal contact fingers 403 in the vicinity of the solder pad 405-1. That is, the width of all the metal contact fingers 403 leading to and terminating on the solder pad 405-1 is less than twice that of a single metal contact finger 403. This advantageously improves efficiency by reducing wide metal contact areas that do not contribute or contribute very little to solar radiation collection.

Figure 7:
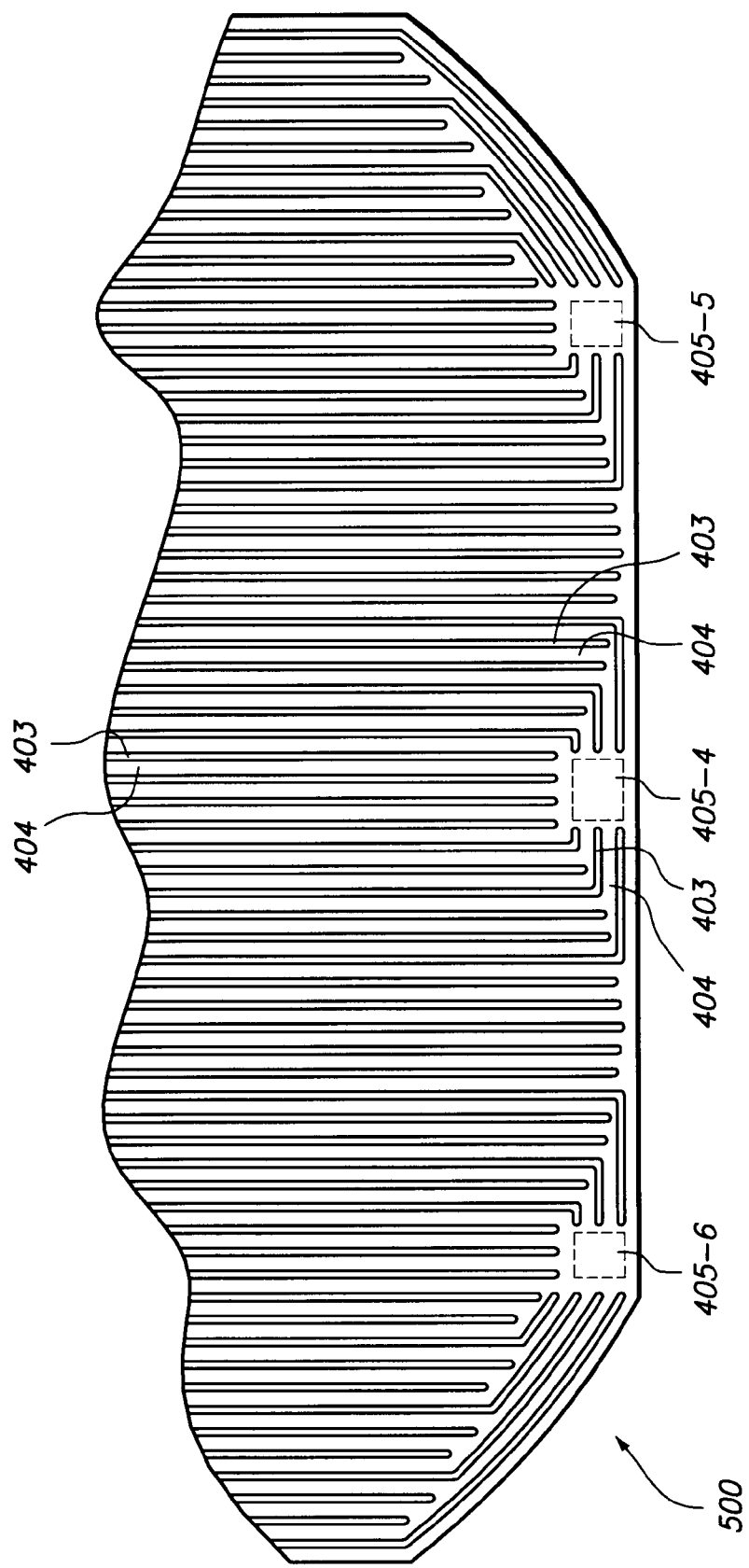
FIG. 7 shows a magnified view of the positive edge portion of the solar cell of FIG. 5.

FIG. 7 shows a magnified view of the positive edge portion of the solar cell 500, which is at the top of FIG. 5. Similar to metal contact fingers 403, some metal contact fingers 404 join together at a single metal contact finger that electrically connects to and terminates on a solder pad 405. In the example of FIG. 7, because the areas occupied by the P-type metal contacts and diffusion regions are generally more than the N-type metal contacts and diffusion regions, three metal contact fingers 404 may share the same metal contact finger that terminates on the solder pad 405.

Comparing FIGS. 6 and 7, the metal contact fingers 404 bend at about 90° angle to lead into corresponding solder pad 405 (e.g., 405-4), while the metal contact fingers 403 bend at an angle greater than 90° to lead into corresponding solder pad 405 (e.g., solder pad 405-1). The metal contact fingers 404 may thus be thought of as having a right angle bend, whereas the metal contact fingers 403 may be thought of as being formed like spokes of a wheel. Depending on implementation, either the positive (i.e., metal contact fingers 404) or the negative (i.e., metal contact fingers 403) metal contact fingers may have the right angle or spoke configuration, and both positive and negative metal contact fingers may have the same configuration. Also, as is evident from the above discussion, two or three metal contact fingers may branch out from a single metal contact finger that leads towards and directly terminates on a corresponding solder pad.

Figure 8:
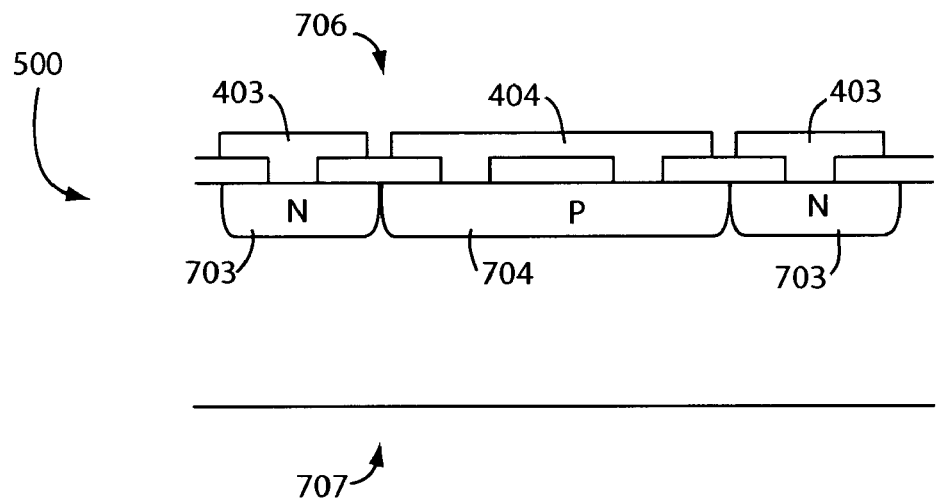
FIG. 8 shows a cross-section view of the solar cell of FIG. 5 in accordance with an embodiment of the present invention.

FIG. 8 shows a cross-section view of the solar cell 500 in accordance with an embodiment of the present invention. The solar cell 500 is a backside junction solar cell in that its N-type diffusion regions 703 and P-type diffusion regions 704 are on the backside 706 of the solar cell. During normal operation, the front side 707 of the solar cell 500 faces the sun to collect solar radiation. As shown in FIG. 8, the metal contact fingers 403 electrically connect to the N-type diffusion regions 703 and the metal contact fingers 404 (only one is shown for clarity of illustration) electrically connect to the P-type diffusion regions 704 on the backside 706.

Figure 9:
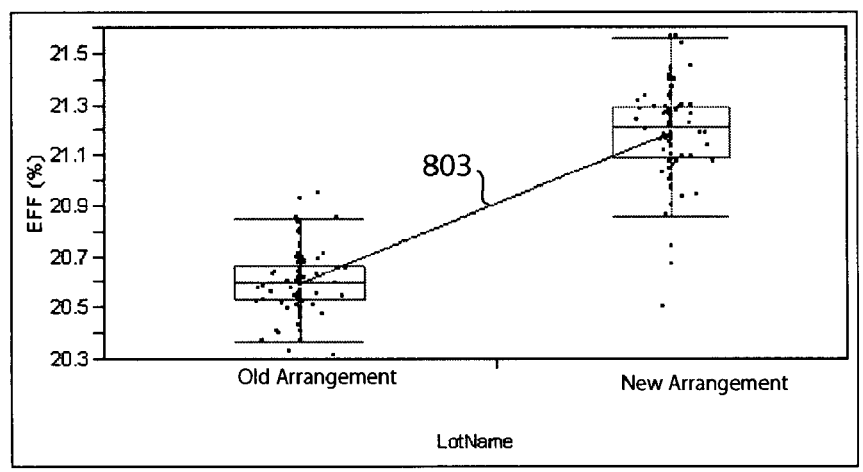
FIG. 9 shows plots illustrating the efficiency of solar cells with the metal contact fingers and solder pads arranged as per the solar cell of FIG. 5 compared to a solar cell with metal contact fingers and solder pads arranged as per the solar cell of FIG. 1.

FIG. 9 shows plots illustrating the efficiency of solar cells with the metal contact fingers and solder pads arranged as per the solar cell 500 (labeled as "new arrangement") compared to a solar cell with metal contact fingers and solder pads arranged as per the solar cell 100 (labeled as "old arrangement"). In FIG. 9, the vertical axis represents efficiency and the horizontal axis indicates plots for the new and old arrangements. A line 803 points to the average efficiencies of the solar cells 100 and 500. As shown in FIG. 9, the average efficiency of the solar cells 500 is higher than that of the solar cells 100. In the study, it has been found that the average efficiency of the solar cells 500 is about 21.2%, whereas the average efficiency of the solar cells 100 is about 20.6%.

Improved solar cell contact fingers and solder pad arrangements have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A solar cell comprising:
   a plurality of positive metal contact fingers, each of the positive metal contact fingers being coupled to one or more P-type diffusion regions on a backside of the solar cell, a front side of the solar cell facing the sun during normal operation to collect solar radiation;
   a plurality of negative metal contact fingers, each of the negative metal contact fingers being coupled to one or more N-type diffusion regions on the backside of the solar cell, the negative metal contact fingers being interdigitated with the positive metal contact fingers;
   a first solder pad providing a contact surface on which an external lead may be soldered onto to electrically connect to the negative metal contact fingers, the negative metal contact fingers comprising at least three metal contact fingers and arranged such that their ends point toward and collectively surround at least three sides of the first solder pad and at least 50% but not an entirety of a perimeter of the first solder pad.

2. The solar cell of claim 1 further comprising a second solder pad providing a contact surface on which an external lead may be soldered onto to electrically connect to the positive metal contact fingers on an edge portion of the solar cell opposite to where the first solder pad is located.

3. The solar cell of claim 1 wherein there are no metal contact fingers or bus bars having a width greater than twice that of one of the negative metal contact fingers and that leads to and terminates on the first solder pad.

4. The solar cell of claim 1 wherein the negative metal contact fingers terminate on the first solder pad.

5. The solar cell of claim 1 wherein at least two of the negative metal contact fingers share another metal contact finger that terminates on the first solder pad.

6. A solar cell comprising:
   a plurality of positive metal contact fingers, each of the positive metal contact fingers being coupled to one or more P-type diffusion region on a backside of the solar cell, a front side of the solar cell facing the sun during normal operation to collect solar radiation;
   a plurality of negative metal contact fingers, each of the negative metal contact fingers being coupled to one or more N-type diffusion region on the backside of the solar cell, the negative metal contact fingers being interdigitated with the positive metal contact fingers; and
   a first solder pad electrically connected to the negative metal contact fingers but not to the positive metal contact fingers, the negative metal contact fingers comprising at least three metal contact fingers and having ends pointing to and collectively covering at least 50% of a perimeter of the first solder pad but not an entirety of the perimeter of the first solder pad.

7. The solar cell of claim 6 further comprising a second solder pad electrically connected to the positive metal contact fingers but not to the negative metal contact fingers on an edge portion of the solar cell opposite to where the first solder pad is located.

8. The solar cell of claim 6 wherein there are no metal contact fingers or bus bars having a width greater than twice that of one of the negative metal contact fingers leading to and terminating on the first solder pad.

9. The solder cell of claim 6 wherein the negative metal contact fingers terminate on the first solder pad.

10. The solder cell of claim 6 wherein at least two of the negative metal contact fingers share another metal contact finger that points to and terminates on the first solder pad.

11. A solar cell comprising:
    a first set of metal contact fingers, each metal contact finger in the first set being electrically coupled to one or more diffusion regions of a first polarity on a backside of the solar cell;
    a second set of metal contact fingers, each metal contact finger in the second set being electrically coupled to one or more diffusion regions of a second polarity opposite to the first polarity on the backside of the solar cell; and
    a first solder pad electrically coupled to the first set of metal contact fingers but not to the second set of metal contact fingers, the first set of metal contact fingers comprising at least three metal contact fingers and being arranged to bend towards the first solder pad at least on opposing ends of the first solder pad to cover more than 50% but not an entirety of a perimeter of the first solder pad.

12. The solar cell of claim 11 further comprising:
    a second solder pad electrically coupled to the second set of metal contact fingers but not to the first set of metal contact fingers, the second set of metal contact fingers being arranged to bend towards the second solder pad.

13. The solar cell of claim 11 wherein the first polarity comprises a negative polarity and the second polarity comprises a positive polarity.

14. The solar cell of claim 12 wherein in the second set of metal contact fingers bends at a 90° angle.

* * * * *